(12) United States Patent
Huber et al.

(10) Patent No.: US 6,806,555 B2
(45) Date of Patent: Oct. 19, 2004

(54) SEMICONDUCTOR COMPONENT AND METHOD FOR FABRICATING IT

(75) Inventors: Jakob Huber, Beyharting (DE); Wolfgang Klein, Zorneding (DE)

(73) Assignee: Infineon Technologies AG, Munich (DE)

(*) Notice: Subject to any disclaimer, the term of this patent is extended or adjusted under 35 U.S.C. 154(b) by 77 days.

(21) Appl. No.: 10/144,213

(22) Filed: May 13, 2002

(65) Prior Publication Data

US 2002/0158308 A1 Oct. 31, 2002

Related U.S. Application Data

(63) Continuation of application No. PCT/DE01/03466, filed on Sep. 7, 2001.

(30) Foreign Application Priority Data

Sep. 11, 2000 (DE) .......................................... 100 44 838

(51) Int. Cl.[7] ..................... H01L 27/082; H01L 27/102; H01L 29/70; H01L 31/11
(52) U.S. Cl. ....................... 257/566; 257/585; 257/591; 257/592; 257/593; 257/565; 257/574
(58) Field of Search .............................. 257/566, 565, 257/574, 585, 591, 592, 593

(56) References Cited

U.S. PATENT DOCUMENTS 4,258,379 A * 3/1981 Watanabe et al. ........... 257/574

FOREIGN PATENT DOCUMENTS

| DE | 24 47 867 | | 4/1975 | |
|---|---|---|---|---|
| DE | 35 45 040 A1 | | 6/1986 | |
| EP | 0 500 233 A2 | | 8/1992 | |
| JP | 57154867 | * | 9/1982 | ........ 27/8 |
| JP | 59188160 | * | 4/1983 | ........ 27/8 |
| JP | 58 084 442 A | | 5/1983 | |
| JP | 01261865 | * | 10/1989 | ........ 29/72 |
| JP | 04 112 539 | | 4/1992 | |
| JP | 07 273 127 A | | 10/1995 | |
| JP | 10 172 981 | | 6/1998 | |
| WO | WO 97/17726 | | 5/1997 | |
| WO | WO9717726 | * | 5/1997 | ........ 21/331 |

OTHER PUBLICATIONS

Müller, R.: "Bauelemente der Halbleiter–Elektronik" [Component of a Semiconductor Electronic], Springer Verlag, 1991, pp. 245–246.

D. Widmann et al.: "Technologie hochintegrierter Schaltungen" [technology of highly integrated circuits], *Springer Verlag*, Germany, 2nd ed., table 8.13, pp. 326–334.

* cited by examiner

Primary Examiner—Nathan J. Flynn
Assistant Examiner—Victor A. Mandala, Jr.
(74) Attorney, Agent, or Firm—Laurence A. Greenberg; Werner H. Stemer; Ralph E. Locher

(57) ABSTRACT

A semiconductor component and a method for fabricating it includes a substrate and an epitaxial layer situated thereon and integrating at least a first and a second bipolar component in the layer. The first and second bipolar components have a buried layer and different collector widths. The buried layer of the second component has a larger layer thickness than that of the first component; exactly one epitaxial layer is provided. The different collector widths produced as a result thereof are influenced by the outdiffusion of the dopant of the buried layers by other substances.

20 Claims, 2 Drawing Sheets

SEMICONDUCTOR COMPONENT AND METHOD FOR FABRICATING IT

CROSS-REFERENCE TO RELATED APPLICATION

This application is a continuation of copending International Application No. PCT/DE01/03466, filed Sep. 7, 2001, which designated the United States.

BACKGROUND OF THE INVENTION

Field of the Invention

The invention lies in the field of semiconductors. The invention relates to a semiconductor component having a substrate and an epitaxial layer situated thereon, at least a first and a second bipolar component being integrated in the layer, the first and second bipolar components having a buried layer and different collector widths.

In the case of bipolar transistors it is customary to connect the collector by a buried, highly doped layer, a so-called buried layer. The buried layer is produced by subjecting the substrate to an ion implantation before the application of the epitaxial layer at the desired location. The lightly doped epitaxial layer is subsequently applied. The base, emitter, and collector wells are subsequently produced on the side of the epitaxial layer that extends to the first main side of the semiconductor component. One possible process sequence in the fabrication of a bipolar transistor is described, for example, in the textbook "Technologie hochintegrierter Schaltungen" [Technology of Large Scale Integrated Circuits] by D. Widmann, H. Mader, H. Friedrich, Springer Verlag, $2^{nd}$ edition, table 8.13 (page 326 to page 334).

The phrase collector width denotes that region of the epitaxial layer that is located between the well of the base located in the epitaxial layer and the buried layer. The collector width is consequently determined by the layer thickness of the epitaxial layer, minus the part of the buried layer that extends into the epitaxial layer, and minus the depth of the well of the base layer that is introduced from the first main side.

The dimensioning of the collector width determines the properties of the bipolar transistor. Bipolar transistors that are intended to be optimized for high limiting frequencies must have a small collector width and an increased doping in the collector. These bipolar transistors are referred to as so-called HF bipolar transistors. By contrast, high-voltage transistors (HV bipolar transistors), which are optimized toward high breakdown voltages, have a large collector width because the space charge zone must not reach the buried layer at maximum operating voltage. The typical collector width of such a bipolar transistor is approximately 450 mm, for an operating voltage of approximately 5 V. The epitaxial layer usually forms the collector in an HV bipolar transistor. The collector doping thus corresponds to the doping of the epitaxial layer, usually $10^{16}$.

Many integrated circuits require both bipolar transistors having a high limiting frequency and bipolar transistors having a high breakdown voltage. On account of the fabrication methods existing heretofore, it is necessary to find a compromise with regard to the properties in the case of the integration of bipolar transistors having different limiting frequencies and bipolar transistors having different breakdown voltages. This means that the performance of the semiconductor component cannot be utilized optimally.

However, if bipolar components having different collector widths are intended to be integrated together in a semiconductor component, then there are currently two possibilities in fabrication: firstly, the depth of the well in the epitaxial layer can be realized differently in the first and second bipolar components. As a result of the increased base width, the limiting frequency of that component whose well (base) extends more deeply into the epitaxial layer is reduced. Furthermore, it is necessary to use an additional mask for producing the base wells of different depths.

Another possibility is for the thickness of the lightly doped epitaxial layer to be implemented differently in the first and second components. However, the fabrication of a second epitaxial layer is associated with high costs, on one hand, and, on the other hand, the manufacturing outlay is thereby increased considerably.

On account of the complicated procedure and a generally identical epitaxial layer, i.e., the epitaxial layer has the same thickness at all points. A compromise is, therefore, sought with regard to the high limiting frequencies and the high breakdown voltages.

SUMMARY OF THE INVENTION

It is accordingly an object of the invention to provide a semiconductor component and method for fabricating it that overcomes the hereinafore-mentioned disadvantages of the heretofore-known devices and methods of this general type and that realizes bipolar components having different collector widths in a simple manner.

With the foregoing and other objects in view, there is provided, in accordance with the invention, a semiconductor component including a substrate, only one epitaxial layer disposed on the substrate, at least a first bipolar component and a second bipolar component integrated in the epitaxial layer, the first bipolar component having a first buried layer having dopant in a first dopant concentration, and a first buried layer thickness, and a first collector with a first collector width, the second bipolar component having a second buried layer having dopant in a second dopant concentration substantially identical to the first dopant concentration, a second buried layer thickness larger than the first buried layer thickness, and a substance influencing diffusion of dopant in the second buried layer, and a second collector with a second collector width different from the first collector width.

With the objects of the invention in view, there is also provided a semiconductor component including a substrate, only one epitaxial layer disposed on the substrate, at least a first and a second bipolar component integrated in the epitaxial layer, the first and second bipolar components having a buried layer and different collector widths, the buried layer of the second bipolar component having a larger layer thickness than the buried layer of the first bipolar component, the buried layer of the first bipolar component and the buried layer of the second bipolar component having dopant with identical dopant concentrations, and at least the buried layer of the second bipolar component having an additional substance influencing diffusion of the dopant in the buried layer.

The invention provides for the buried layer of the second bipolar component to have a greater layer thickness than that of the first component, precisely one epitaxial layer being provided. The wells forming the base in the epitaxial layer may, but need not, have an identical depth.

The invention is based on the insight that the outdiffusion of the dopant of the buried layer can be influenced by other substances. This enables an extremely simple fabrication method because the buried layers of the first and second components are firstly implanted into the substrate with an identical dopant concentration. An additional substance is subsequently introduced into the buried layer of the second component, which additional substance influences the diffusion of the dopant in the buried layer of the second component. By way of example, the additional substance can be introduced by a mask technique and by ion implantation. The epitaxial layer is subsequently applied in a customary manner in a single step.

The invention has the advantage that only an additional mask technique and an additional implantation are necessary for an additional transistor variant, that is to say, for a bipolar transistor having a varying collector width. The costs in comparison with an additional epitaxial layer, as is provided for example, in the prior art, are, therefore, relatively low.

Because the collector always ends at the highly doped buried layer of the bipolar component, the transistor properties, thus, change to a lesser extent with an increased collector-emitter voltage than in contrast to a thicker (lightly doped) collector layer.

The semiconductor component according to the invention can be realized both with NPN transistors and with PNP transistors. In the case of NPN transistors, arsenic or antimony is advantageously used as the dopant of the buried layers. Phosphorus is used, at least in the buried layer of the second component, as an additional substance that influences the diffusion of the aforementioned dopant in the desired manner.

If the bipolar component is a PNP transistor, then boron is preferably used as the dopant of the buried layers. The additional substance used at least in the buried layer of the second component is, advantageously, nitrogen.

The substance in the buried layer of the second component can also be fluorine.

In accordance with another feature of the invention, the first bipolar component has a first well forming a base in the epitaxial layer, the first well has a given depth, the second bipolar component has a second well forming a base in the epitaxial layer, and the second well has a depth substantially identical to the given depth.

In accordance with a further feature of the invention, it is also conceivable that a respectively different concentration of the substance that influences the diffusion of the dopant is introduced both into the buried layer of the first bipolar component and into the buried layer of the second bipolar component.

In accordance with an added feature of the invention, in an advantageous refinement of NPN bipolar transistors, the additional substance at least in the buried layer of the second component is provided only in the region of the emitter located in the first well (base). Such a fabrication step can be realized by the mask covering the bipolar transistor such that an ion implantation with the additional substance is effected only in the region of the well of the emitter.

If the additional substance is introduced only in the region below the emitter, the collector width changes only below the active transistor. The collector width remains unchanged over the remaining area of the buried layer, which is referred to as passive region. If the collector width is reduced by the additional substance in the region of the emitter well, then a region with an increased collector width remains on the remaining region of the buried layer. As a result, it is possible to realize a bipolar component that has reduced capacitances and increased breakdown voltages in this region.

In accordance with an additional feature of the invention, the second bipolar component has a well and an emitter disposed in the well and a second substance is in the buried layer of the second bipolar component only in a region outside the emitter.

Such a refinement can be realized for PNP bipolar transistors by introducing a further additional substance into the buried layer outside the emitter region, the further additional substance inhibiting the outdiffusion. By way of example, nitrogen inhibits the outdiffusion of boron.

In accordance with yet another feature of the invention, there is provided a selectively implanted collector in the epitaxial layer, the collector disposed in a region below the emitter.

With the objects of the invention in view, there is also provided a method for fabricating a semiconductor component including the steps of applying an epitaxial layer to a substrate in a single step, integrating at least a first and a second bipolar component in the epitaxial layer, the first and second bipolar components each having a buried layer, implanting each of the buried layers into the substrate with an identical dopant concentration, introducing an additional substance at least into the buried layer of the second bipolar component, the additional substance influencing diffusion of dopant in the buried layer of the second bipolar component, and forming a base, an emitter, and a collector in the epitaxial layer by producing wells in the epitaxial layer.

With the objects of the invention in view, there is also provided a method for fabricating a semiconductor component including the steps of applying an epitaxial layer to a substrate in a single step, integrating at least a first and a second bipolar component in the epitaxial layer by implanting buried layers of the first and second bipolar components into the substrate, the buried layers having an identical dopant concentration, introducing an additional substance at least into the buried layer of the second bipolar component, the additional substance influencing diffusion of dopant in the buried layer of the second bipolar component, and forming, in the epitaxial layer, a base, an emitter, and a collector for at least one of the first and second bipolar components by producing wells in the epitaxial layer.

In accordance with yet a further mode of the invention, at least one of the first and second bipolar components are covered with a mask to effect ion implantation of the additional substance only at a location of the well of the emitter.

In accordance with a concomitant mode of the invention, at least one of the first and second bipolar components are covered with a mask only at a location of the well of the emitter and an ion implantation is effected with a second additional substance outside the emitter region but in the region of the buried layer.

Other features that are considered as characteristic for the invention are set forth in the appended claims.

Although the invention is illustrated and described herein as embodied in a semiconductor component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
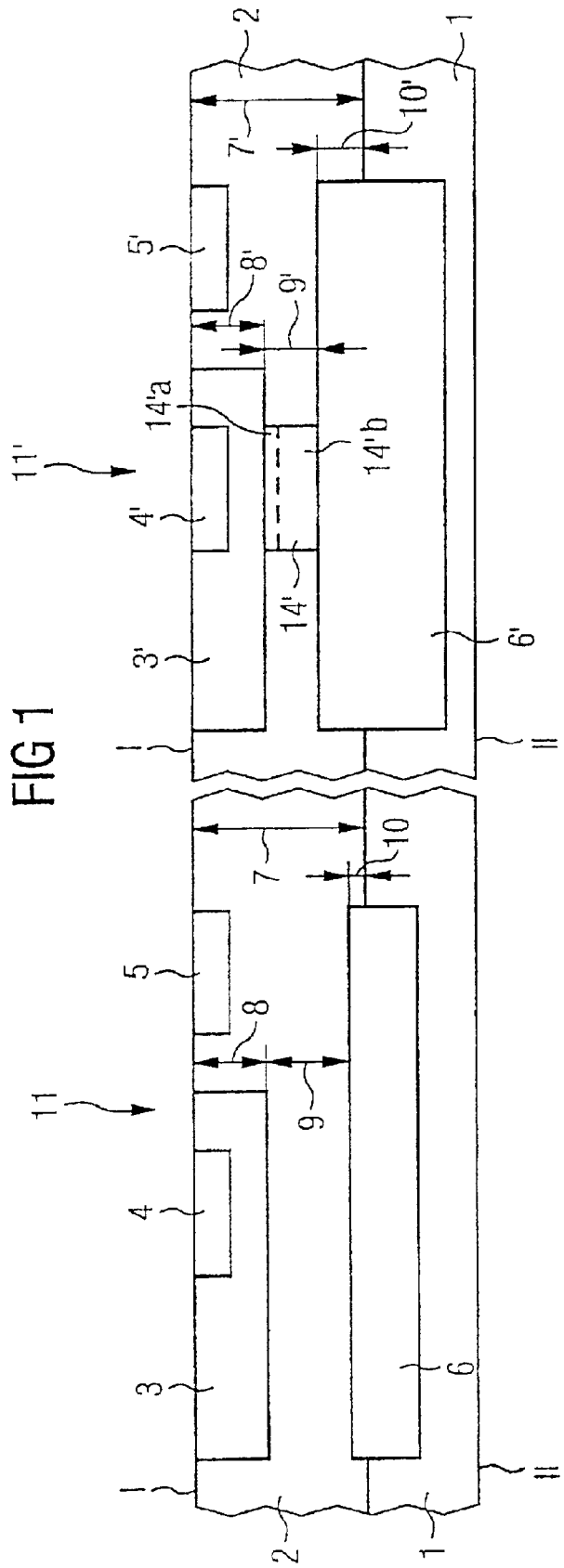
FIG. 1 is a fragmentary, cross-sectional view of a semiconductor component according to the invention with a first and a second bipolar component.

Referring now to the figures of the drawings in detail and first, particularly to FIG. 1 thereof, there is shown a sectional illustration of a semiconductor component according to the invention, having a first bipolar component 11 and a second bipolar component 11'. The first and second bipolar components 11, 11' are disposed in an epitaxial layer 2 located on a substrate 1. Situated on a first main side I of the semiconductor component are the active components, that is to say, the base, emitter, and collector wells located in the epitaxial layer 2. In principle, the bipolar transistors are formed in accordance with a conventional. Such a bipolar transistor having a buried layer is described for example in the textbook "Bauelemente der Halbleiter-Elektronik" [Components of Semiconductor Electronics"] by R. Muller, Springer Verlag 1991, $4^{th}$ edition, pages 245, 246.

The following brief description of the construction of a bipolar component is limited to the first component 11. In the epitaxial layer 2, a first well 3, serving as base, is provided in a manner adjoining the first main side I. Disposed in the first well 3 is a second well 4, which likewise extends to the first main side I and forms the emitter of the bipolar component. In this case, the second well 4 is completely surrounded laterally by the first well 3. Provided adjacent to the first well 3 is a third well 5, which is located in the epitaxial layer 2 in a manner extending to the first main side I.

The first well 3 has a predetermined depth 8 in the epitaxial layer 2. The thickness of the epitaxial layer 2 of the semiconductor component is designated by 7. A buried layer 6 extends below the first well 3 and the third well 5, the buried layer 6 having been introduced into the substrate 1 by ion implantation before the application of the epitaxial layer 2. The distance 9, which is formed between the first well 3, that is to say the base, and the buried layer 6, represents the collector width 9 of the bipolar component. The property of the bipolar component is set by the collector width. If the bipolar component has a small collector width and high collector doping, then the bipolar component is suitable in particular for high limiting frequencies, but not very suitable for high breakdown voltages. High breakdown voltages can be obtained by a large collector width and low collector doping. The bipolar component 11 that is illustrated on the left-hand side of FIG. 1 is, therefore, preferably suitable for high voltages, while the bipolar component 11' located on the right-hand side is optimized toward high frequencies.

The depths 8, 8' of the respective first well 3, 3' (base) in both bipolar components 11, 11' may be formed in identical fashion. The thickness of the epitaxial layer 7, 7' in both bipolar components 11, 11' is formed in identical fashion. The epitaxial layer has the same doping in both cases because it is applied in a single method step. The epitaxial layer is preferably lightly doped.

The special feature of the semiconductor component according to the invention as illustrated in FIG. 1 is that the bipolar components 11, 11' are located in a single epitaxial layer 7, 7', but the collector width 9, 9' is formed in varying fashion. Such a semiconductor component can be realized by a procedure wherein, before the application of the epitaxial layer 2 and the production of the base, emitter, and collector wells located therein, the buried layer 6' of the second bipolar component 11' was provided with an additional substance (not visible in FIG. 1) that influences, that is to say, intensifies, the outdiffusion of the dopant of the buried layer 6'.

A modification of the fabrication method used heretofore is limited to performing only a single additional mask step with a subsequent ion implantation. Consequently, the semiconductor component according to the invention, which can be optimized in terms of its electrical properties by comparison with the prior art, can be fabricated in an extremely simple manner.

The collector of the second bipolar component 11' (HF transistor) can additionally be doped more highly than the epitaxial layer through a dedicated implantation—so-called selectively implanted collector (well 14'). The increased doping reduces the width of the space charge zone and the breakdown voltage. At maximum operating voltage of the HF transistor 11', which is lower than the maximum operating voltage of the HV transistor 11, the space charge zone no longer reaches the buried layer 6', i.e., the space charge zone (14'a) is then smaller than the collector width 9'. Consequently, the region of the collector without space charge zone (14'b) is only parasitic resistance. The reduced collector width reduces this region and, thus, the parasitic resistance.

The bipolar components 11, 11' can be embodied both as NPN transistors and as PNP transistors. In this case, the two components 11, 11' may be of the same transistor type or else of different transistor types. If the bipolar component is an NPN transistor, then arsenic or antimony is preferably used as dopant of the buried layer 6, 6'. This dopant is introduced in the same, that is to say, identical, concentration during fabrication in both components 11, 11'. The addition of phosphorus in the buried layer 6' of the second component 11' intensifies the outdiffusion of arsenic or antimony. In a PNP transistor, the buried layer is composed of boron, for example, in which case the outdiffusion can be reduced by nitrogen and intensified by fluorine.

It is conceivable for the additional substance to be added only to the buried layer 6' of the second component; however, it is also possible, of course, to add the additional substance in the buried layers 6, 6'both of the first and of the second component 11, 11'. A different collector width 9, 9' can nevertheless be realized by choosing a different concentration of the additional substance.

Figure 2:
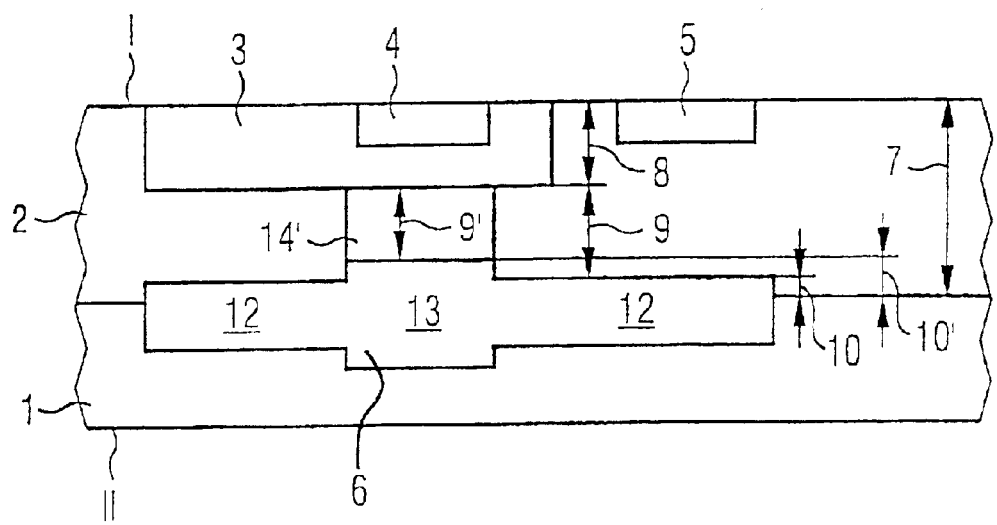
FIG. 2 is a fragmentary, cross-sectional view of an alternative configuration of a bipolar component that can be used in the semiconductor component according to the invention.

FIG. 2 shows an alternatively configured bipolar component that can be integrated in a semiconductor component together or alternatively with the bipolar components 11, 11' shown in FIG. 1. In the fabrication of the bipolar component shown in FIG. 2, the mask for the implantation of the additional substance was formed such that, in the case of an NPN component, only the second well 4, forming the emitter, remains spared, while in the case of a PNP component, the second well 4 is covered and the rest of the buried layer remains spared. As a result of the subsequent ion implantation of the additional substance (phosphorus in the case of an NPN component, nitrogen in the case of a PNP component), only the outdiffusion of the dopant of the buried layer 6 in the region below the emitter 4 is intensified (NPN component) or inhibited (PNP component). The buried layer 6, thus, has a step-like course 10, 10'. The collector width below the third well 5 (collector) and also in parts of the first well 3 (base), thus, remains unchanged. The bipolar component illustrated in FIG. 2 enables reduced capacitances and increased breakdown voltages in the region 12 of the buried layer. The selectively implanted collector 14', already described with respect to FIG. 1, is disposed below the emitter 4 in the epitaxial layer 2.

The thickness of the epitaxial layer 2 of the component in accordance with FIG. 2 corresponds to the thickness of the epitaxial layer 2 in the semiconductor component of FIG. 1. Likewise, the depth 8 of the first well 3 (base) of FIG. 2 is identical to the depth 8 of the first well 3, 3' of the bipolar components from FIG. 1.

Optimization of the electrical properties of a plurality of bipolar components in a semiconductor component that is conventionally fabricated is possible in a simple manner by an additional substance varying the diffusion of a dopant of the buried layer of a bipolar transistor. Such a process makes it possible to set the collector width that determines the electrical properties.

We claim:

1. A semiconductor component, comprising:
   a substrate;
   only one epitaxial layer disposed on said substrate;
   at least a first bipolar component and a second bipolar component integrated in said epitaxial layer;
   said first bipolar component having:
      a first buried layer having:
         dopant in a first dopant concentration; and
         a first buried layer thickness;
         a substance influencing diffusion of said dopant in said first buried layer, said substance having a given concentration; and
      a first collector with a first collector width;
   said second bipolar component having:
      a second buried layer having:
         dopant in a second dopant concentration substantially identical to said first dopant concentration;
         a second buried layer thickness larger than said first buried layer thickness; and
         a substance influencing diffusion of dopant in said second buried layer, said substance having a concentration different from said given concentration; and
      a second collector with a second collector width different from said first collector width.

2. The semiconductor component according to claim 1, wherein:
   said first bipolar component has a first well forming a base in said epitaxial layer;
   said first well has a given depth;
   said second bipolar component has a second well forming a base in said epitaxial layer; and
   said second well has a depth substantially identical to said given depth.

3. The semiconductor component according to claim 1, wherein said dopant in said first buried layer and said second buried layer is one of the group consisting of arsenic and antimony.

4. The semiconductor component according to claim 3, wherein said substance in said second buried layer is phosphorus.

5. The semiconductor component according to claim 3, wherein:
   said second bipolar component has a well and an emitter disposed in said well; and
   said substance in said second buried layer is only in a region of said emitter.

6. The semiconductor component according to claim 5, including a selectively implanted collector in said epitaxial layer, said collector disposed in a region below said emitter.

7. The semiconductor component according to claim 5, including a selectively implanted collector in said epitaxial layer, said collector disposed in a region below said emitter.

8. The semiconductor component according to claim 1, wherein said dopant in said first buried layer and said second buried layer is boron.

9. The semiconductor component according to claim 8, wherein said substance in said second buried layer is one of the group consisting of nitrogen and fluorine.

10. The semiconductor component according to claim 9, wherein:
    said second bipolar component has a well and an emitter disposed in said well; and
    a second substance is in said second buried layer only in a region outside said emitter.

11. The semiconductor component according to claim 10, including a selectively implanted collector in said epitaxial layer, said collector disposed in a region below said emitter.

12. A semiconductor component, comprising:
    a substrate;
    only one epitaxial layer disposed on said substrate;
    at least a first and a second bipolar component integrated in said epitaxial layer;
    said first and second bipolar components having a buried layer and different collector widths;
    said buried layer of said first bipolar component having a substance influencing diffusion of said dopant in said buried layer of said first bipolar component;
    said buried layer of said second bipolar component having a larger layer thickness than said buried layer of said first bipolar component;
    said buried layer of said first bipolar component and said buried layer of said second bipolar component having dopant with identical dopant concentrations; and
    at least said buried layer of said second bipolar component having an additional substance influencing diffusion of said dopant in said buried layer, said additional substance having a given concentration; and
    said substance in said buried layer of said first bipolar component having a concentration different from said given concentration.

13. The semiconductor component according to claim 12, wherein:
    said first bipolar component has a first well forming a base in said epitaxial layer;
    said first well has a given depth;
    said second bipolar component has a second well forming a base in said epitaxial layer; and
    said second well has a depth identical to said given depth.

14. The semiconductor component according to claim 12, wherein said dopant is one of the group consisting of arsenic and antimony.

15. The semiconductor component according to claim 14, wherein said substance in said buried layer of said second bipolar component is phosphorus.

16. The semiconductor component according to claim 14, wherein:
    said second bipolar component has a well and an emitter disposed in said well; and
    said substance in said buried layer of said second bipolar component is only in a region of said emitter.

17. The semiconductor component according to claim 16, including a selectively implanted collector in said epitaxial layer, said collector disposed in a region below said emitter.

18. The semiconductor component according to claim 12, wherein said dopant in said buried layer of said first bipolar component and said buried layer of said second bipolar component is boron.

19. The semiconductor component according to claim 18, wherein said substance in said buried layer of said second bipolar component is one of the group consisting of nitrogen and fluorine.

20. The semiconductor component according to claim 19, wherein:
- said second bipolar component has a well and an emitter disposed in said well;
- a second substance is in said buried layer of said second bipolar component only in a region outside said emitter.

* * * * *